US011585013B2

(12) United States Patent
Suzuki et al.

(10) Patent No.: US 11,585,013 B2
(45) Date of Patent: Feb. 21, 2023

(54) FE—CO—AL ALLOY MAGNETIC THIN FILM

(71) Applicants: THE BOARD OF TRUSTEES OF THE UNIVERSITY OF ALABAMA, Tuscaloosa, AL (US); TDK CORPORATION, Tokyo (JP)

(72) Inventors: Takao Suzuki, Tuscaloosa, AL (US); Tim Mewes, Northport, AL (US); Gary Mankey, Tuscaloosa, AL (US); Isao Kanada, Tokyo (JP); Yusuke Ariake, Tokyo (JP)

(73) Assignees: THE BOARD OF TRUSTEES OF THE UNIVERSITY OF ALABAMA, Tuscaloosa, AL (US); TDK CORPORATION, Tokyo (JP)

( * ) Notice: Subject to any disclaimer, the term of this patent is extended or adjusted under 35 U.S.C. 154(b) by 414 days.

(21) Appl. No.: 16/758,915

(22) PCT Filed: Oct. 24, 2018

(86) PCT No.: PCT/US2018/057314
§ 371 (c)(1),
(2) Date: Apr. 24, 2020

(87) PCT Pub. No.: WO2019/084141
PCT Pub. Date: May 2, 2019

(65) Prior Publication Data
US 2020/0347516 A1 Nov. 5, 2020

Related U.S. Application Data
(60) Provisional application No. 62/576,779, filed on Oct. 25, 2017.

(51) Int. Cl.
*C30B 29/52* (2006.01)
*C30B 29/16* (2006.01)
(Continued)

(52) U.S. Cl.
CPC .............. *C30B 29/52* (2013.01); *B32B 15/01* (2013.01); *B32B 15/04* (2013.01); *B32B 15/043* (2013.01); *B32B 15/18* (2013.01); *B32B 15/20* (2013.01); *C22C 5/04* (2013.01); *C22C 19/07* (2013.01); *C22C 30/00* (2013.01); *C22C 38/06* (2013.01); *C22C 38/10* (2013.01); *C23C 14/18* (2013.01); *C23C 14/185* (2013.01); *C23C 14/34* (2013.01); *C23C 14/35* (2013.01); *C23C 14/352* (2013.01); *C23C 28/02* (2013.01); *C23C 28/021* (2013.01); *C23C 28/023* (2013.01); *C23C 30/00* (2013.01); *C23C 30/005* (2013.01); *C30B 23/02* (2013.01); *C30B 23/025* (2013.01); *C30B 29/16* (2013.01); *H01F 1/147* (2013.01); *C22C 2202/02* (2013.01); *Y10T 428/115* (2015.01); *Y10T 428/1136* (2015.01); *Y10T 428/1157* (2015.01); *Y10T 428/1164* (2015.01); *Y10T 428/12597* (2015.01); *Y10T 428/12604* (2015.01);
(Continued)

(58) Field of Classification Search
CPC ....... C30B 23/025; C30B 23/02; C30B 29/52; C30B 29/16; B32B 15/01; B32B 15/04; B32B 15/043; B32B 15/18; B32B 15/20; C22C 5/04; C22C 30/00; C22C 38/06; C22C 38/10; C22C 2202/02; C22C 19/07; C23C 14/18; C23C 14/185; C23C 14/34; C23C 14/35; C23C 14/352; C23C 28/021; C23C 28/023; C23C 28/02; C23C 30/00; C23C 30/005; H01F 1/147; Y10T 428/12597; Y10T 428/12604; Y10T 428/12611; Y10T 428/12618; Y10T 428/12667; Y10T 428/115; Y10T 428/1157; Y10T 428/1164; Y10T 428/1136; Y10T 428/12951; Y10T 428/26; Y10T 428/265; Y10T 428/12931; Y10T 428/24967; Y10T 428/2495
See application file for complete search history.

(56) References Cited

U.S. PATENT DOCUMENTS 4,003,813 A 1/1977 Hattori et al.
4,563,396 A 1/1986 Fukuda et al.
(Continued)

FOREIGN PATENT DOCUMENTS

GB 807498 A 1/1959
JP 2006049706 A 2/2006
JP 2009070857 A 4/2009

OTHER PUBLICATIONS

Kuanr, Bijoy et al., "Relaxation in epitaxial Fe films measured by ferromagnetic resonance", Journal of Applied Physics, 2004, 95(11), 6610-6612, (June).

(Continued)

*Primary Examiner* — Michael E. La Villa
(74) *Attorney, Agent, or Firm* — Meunier Carlin & Curfman LLC

(57) ABSTRACT

An Fe—Co—Al alloy magnetic thin film contains, in terms of atomic ratio, 20% to 30% Co and 1.5% to 2.5% Al. The Fe—Co—Al alloy magnetic thin film has a crystallographic orientation such that the (100) plane is parallel to a substrate surface and the <100> direction is perpendicular to the substrate surface. The Fe—Co—Al alloy magnetic thin film has good magnetic properties, that is, a magnetization of 1440 emu/cc or more, a coercive force of less than 100 Oe, a damping factor of less than 0.01, and an FMR linewidth $\Delta H$ at 30 GHz of less than 70 Oe.

13 Claims, No Drawings

(51) Int. Cl.
*C30B 23/02* (2006.01)
*B32B 15/01* (2006.01)
*H01F 1/147* (2006.01)
*C22C 38/10* (2006.01)
*C22C 38/06* (2006.01)
*C23C 14/35* (2006.01)
*C23C 14/18* (2006.01)
*C22C 5/04* (2006.01)
*C22C 30/00* (2006.01)
*C23C 14/34* (2006.01)
*B32B 15/04* (2006.01)
*C23C 28/02* (2006.01)
*C23C 30/00* (2006.01)
*B32B 15/18* (2006.01)
*C22C 19/07* (2006.01)
*B32B 15/20* (2006.01)

(52) U.S. Cl.
CPC ............... *Y10T 428/12611* (2015.01); *Y10T 428/12618* (2015.01); *Y10T 428/12667* (2015.01); *Y10T 428/12931* (2015.01); *Y10T 428/12951* (2015.01); *Y10T 428/2495* (2015.01); *Y10T 428/24967* (2015.01); *Y10T 428/26* (2015.01); *Y10T 428/265* (2015.01)

(56) References Cited

U.S. PATENT DOCUMENTS

| | | |
|---|---|---|
| 4,645,722 A | 2/1987 | Katayama et al. |
| 5,408,565 A | 4/1995 | Levy et al. |
| 5,652,054 A | 7/1997 | Kikitsu et al. |
| 5,660,929 A | 8/1997 | Sagawa et al. |
| 5,750,044 A | 5/1998 | Yoneyama et al. |
| 5,998,048 A | 12/1999 | Zhu et al. |
| 8,520,433 B1 | 8/2013 | Mizukami et al. |
| 9,842,678 B2 | 12/2017 | Suzuki et al. |
| 2002/0008937 A1 | 1/2002 | Sano et al. |
| 2008/0166592 A1 | 7/2008 | Yonetsu et al. |
| 2008/0182342 A1* | 7/2008 | Parkin ............... H01F 10/3254 257/E21.001 |
| 2011/0186948 A1 | 8/2011 | Pochet et al. |
| 2012/0250186 A1 | 10/2012 | Irisawa et al. |
| 2013/0236720 A1 | 9/2013 | Heiman et al. |
| 2017/0117074 A1 | 4/2017 | Suzuki et al. |
| 2019/0318860 A1 | 10/2019 | Suzuki et al. |
| 2020/0082966 A1 | 3/2020 | Suzuki et al. |

OTHER PUBLICATIONS

International Search Report and Written Opinion, issued in corresponding application No. PCT/US2018/57314, dated Jan. 17, 2019, 8 pages.

Kanada et al. "Soft magnetic properties and damping parameter of (FeCo )—Al alloy thin films," AIP Advances, vol. 7, article No. 056105, Feb. 6, 2017.

Serizawa et al. "Structure Analysis of Fe—Co and Fe—Co—B AUoy Thin Films Formed on MgO(001) Substrate," 1-3 Journal of the Magnetics Society of Japan, vol. 41, issue 5, Sep. 1, 2017.

* cited by examiner

FE—CO—AL ALLOY MAGNETIC THIN FILM

CROSS-REFERENCE TO RELATED APPLICATIONS

This is a national phase application filed under 35 U.S.C. § 371 of PCT International Application No. PCT/US2018/057314, filed on Oct. 24, 2018, entitled "FE—CO—AL ALLOY MAGNETIC THIN FILM," which claims the benefit of U.S. Provisional Application No. 62/576,779, filed Oct. 25, 2017, which are hereby incorporated herein by reference in their entireties.

BACKGROUND OF THE INVENTION

1. Field of the Invention

The present invention relates to a soft magnetic material used in a high-frequency range that covers the gigahertz range and specifically to an iron (Fe)-cobalt (Co)-aluminum (Al)-based magnetic thin film having a large magnetization, a low damping factor, and a small coercive force.

2. Description of the Related Art

With increases in capacity and speed provided by communication technologies, magnetic materials used for producing electronic components, such as inductors, low-pass filters, and bandpass filters, are required to have a high magnetic permeability and a low magnetic loss even in a high-frequency band including the gigahertz band.

Magnetic losses in soft magnetic materials are typically caused by, for example, hysteresis loss, eddy current loss, and residual loss. The term "residual loss" refers to magnetic losses other than hysteresis loss or eddy current loss.

Hysteresis loss is proportional to the area of a magnetic hysteresis loop. Thus, reducing the coercive force reduces the area of a magnetic hysteresis loop and thereby reduces the hysteresis loss.

It is known that eddy current loss can be effectively reduced by increasing the electric resistance of a magnetic material and, in the case where a thin film is to be magnetized in an in-plane direction, by reducing the thickness of the thin film.

An example of residual loss is a magnetic loss caused by domain-wall resonance, resonance caused by rotation magnetization (i.e., ferromagnetic resonance), or the like. In order to limit domain-wall resonance, it is effective to reduce the size of crystals of a magnetic material to a critical single-domain grain size or less so as to eliminate the domain walls. The critical single-domain grain size of isotropic iron crystals is about 28 nm.

The magnetic loss resulting from resonance caused by rotation magnetization can be reduced by narrowing the resonance linewidth even at a high frequency considerably close to the resonance frequency. That is, narrowing the resonance linewidth enables a reduction in magnetic loss in a wider frequency band. It is considered that the resonance linewidth of a magnetic material can be effectively narrowed by reducing inhomogeneity in the composition and disorder in crystallographic orientation of the magnetic material and minimizing the amount of defects and impurities contained in the surface and inside of the magnetic material.

The resonance linewidth can be measured by ferromagnetic resonance (FMR). The relationship between the resonance frequency fr and the resonance linewidth ΔH can be represented by Expression (1) below.

$$\Delta H = \Delta H_0 + 4\pi/(\sqrt{3}\gamma) \cdot \alpha_{eff} \cdot fr \quad (1)$$

where $\Delta_{H\,0}$ represents a linewidth at a frequency of 0 Hz, γ represents a gyromagnetic ratio, and $\alpha_{eff}$ represents an effective damping factor. Specifically, $\alpha_{eff}$ and $\Delta H_0$ are not intrinsic physical properties and are parameters dependent on extrinsic factors, such as crystallographic orientation and microstructure.

In "Relaxation in epitaxial Fe films measured by ferromagnetic resonance", Bijoy K, R. E. Camley, and Z. Celinski (hereinafter, referred to as "NPL 1"), ferromagnetic resonance of an iron thin film prepared by molecular beam epitaxy is measured. The smaller the thickness of the thin film, the larger the resonance linewidth due to extrinsic factors, such as surface roughness, accordingly. The intrinsic damping factor of the material which is determined by eliminating the influences of the extrinsic factors is reportedly small, that is, 0.003 with respect to the magnetic field linewidth and 0.0043 with respect to the frequency linewidth.

The influential extrinsic factors are the surface roughness of the material, strain and defects contained in the material, and the crystallographic orientation of the material. It is important to control these extrinsic factors. In particular, heating the substrate is effective to remove a strain in the material and control the crystallographic orientation of the material.

It is also widely known that increasing magnetization is effective to enhance magnetic permeability.

SUMMARY OF THE INVENTION

The present invention provides a magnetic material having a large magnetization, a low effective damping factor, a small resonance linewidth, and a small coercive force which is suitable as a material for high-frequency electronic components.

An Fe—Co—Al alloy magnetic thin film according to an embodiment of the present invention contains, in terms of atomic ratio, 20% to 30% Co and 1.5% to 2.5% Al, the Fe—Co—Al alloy magnetic thin film having a crystallographic orientation such that a (100) plane is parallel to a substrate surface and a <100> direction is perpendicular to the substrate surface.

DESCRIPTION OF THE PREFERRED EMBODIMENTS

The present invention is described below in detail. It should be understood that the scope of the present invention is not limited by the following example of implementation of the present invention (hereinafter, such examples are referred to as "embodiment"). The structural features of the present invention are not limited by the embodiment described below and features easily perceivable by a person skilled in the art, features that are substantially identical, and features that are equivalent are all included within the scope of the present invention.

An Fe—Co—Al alloy magnetic thin film according to an embodiment of the present invention contains, in terms of atomic ratio, 20% to 30% Co. The magnetization of the Fe—Co—Al alloy magnetic thin film has a local maximum when the Co content in the magnetic thin film is 20% to 35%. The damping factor of the Fe—Co—Al alloy magnetic thin film has a local minimum when the Co content in the magnetic thin film is 20% to 30%. Thus, the Fe—Co—Al alloy magnetic thin film has a suitable magnetization and a suitable damping factor when the Co content in the magnetic thin film is 20% to 30%.

The Fe—Co—Al alloy magnetic thin film according to the embodiment contains, in terms of atomic ratio, 1.5% to 2.5% Al. Adding Al to the Fe—Co—Al alloy magnetic thin film reduces the coercive force of the Fe—Co—Al alloy magnetic thin film. The Fe—Co—Al alloy magnetic thin film has a small coercive force when the Al content in the Fe—Co—Al alloy magnetic thin film is 1.5% to 5%. However, an excessively low Al content in the Fe—Co—Al alloy magnetic thin film may lead to a reduction in the magnetization of the Fe—Co—Al alloy magnetic thin film. When the Al content in the Fe—Co—Al alloy magnetic thin film is 1.5% to 2.5%, the Fe—Co—Al alloy magnetic thin film has a small coercive force and a large magnetization.

The Fe—Co—Al alloy magnetic thin film according to the embodiment has a crystallographic orientation such that the (100) plane is parallel to a substrate surface and the <100> direction is perpendicular to the substrate surface. Since a disturbance in the motion of the magnetic moment which results from disorder in crystallographic orientation and defects increases the resonance linewidth, reducing the disorder in crystallographic orientation narrows the linewidth of magnetic resonance and reduces the likelihood of magnetic loss occurring at high frequencies.

Method for Producing Magnetic Material

The magnetic material according to the embodiment may be produced by the following method. First, target materials, that is, raw materials, are prepared. The target materials may be single-element targets each composed of Fe, Co, or Al. Alternatively, a target material having a composition adjusted such that the thin film has the desired composition may be used. Two or more alloy targets may be used in combination in order to produce a thin film having the desired composition. In another case, an alloy target may be used in combination with a single-element target. The alloy target may be any one of an Fe—Co—Al alloy target, an Fe—Co alloy target, an Fe—Al alloy target, and a Co—Al alloy target. Since oxygen reduces the saturation magnetization of the magnetic material and increases the coercive force of the magnetic material, the oxygen content in the target material is desirably reduced to a minimum level.

The substrate used for the deposition of the film may be composed of a metal, glass, silicon, a ceramic, or the like and is preferably not reactive with Fe, Co, Al, an Fe—Co—Al alloy, an Fe—Co alloy, an Fe—Al alloy, or a Co—Al alloy. The substrate is particularly preferably a single-crystal MgO substrate whose (100) plane serves as a surface of the substrate.

The amount of impurity elements, such as oxygen, contained in a vacuum chamber included in the film deposition apparatus, in which sputtering is conducted, is desirably reduced to a minimum level. Thus, the vacuum chamber is preferably evacuated to $10^{-5}$ Torr or less and is more preferably evacuated to $10^{-6}$ Torr or less.

Prior to film deposition, the target material is desirably subjected to sufficient preliminary sputtering in order to expose a clean surface of the target material. Accordingly, the film deposition apparatus desirably has a sealed structure disposed between the substrate and the target and configured to be operable in a vacuum state. Sputtering is preferably performed by magnetron sputtering. The atmosphere gas is Ar, which is unreactive with the magnetic material. The power source used for sputtering may be a DC or RF power source and selected appropriately depending on the target material used.

The above target material and substrate are used for film deposition. Examples of the film deposition method include co-sputtering in which plural targets are used simultaneously to deposit plural components at a time and a multilayer-film method in which plural targets are used one by one sequentially to form a multilayer film.

In a multilayer-film method, an appropriate combination of target materials necessary for producing a magnetic material having the desired composition is selected from Fe, Co, Al, an Fe—Co—Al alloy, an Fe—Co alloy, an Fe—Al alloy, and a Co—Al alloy. Layers formed using the respective targets are stacked on top of one another in a predetermined order repeatedly to form a multilayer body having a predetermined thickness. In the case where the substrate includes an oxide of an element having a higher standard free energy of formation of an oxide than Al, such as $SiO_2$ glass, a film that does not contain Al which is composed of Fe, Co, or an Fe—Co alloy is preferably deposited first on the substrate in order to prevent oxidation of Al. In the case where the substrate includes an oxide of an element that has a higher standard free energy of formation of an oxide than Fe, the reactivity of the oxide with samples needs to be confirmed before use.

The thickness of the Fe—Co—Al-based magnetic thin film according to the embodiment may be adjusted as desired by changing film-deposition rate, film-deposition time, argon-atmosphere pressure, and, in the case where the film is formed by a multilayer-film method, the number of times film deposition is conducted. In order to adjust the thickness of the Fe—Co—Al-based magnetic thin film, the relationship between the deposition conditions and the thickness of the Fe—Co—Al-based magnetic thin film needs to be determined in advance. The thickness of the Fe—Co—Al-based magnetic thin film is commonly measured by contact profilometry, X-ray reflectometry, ellipsometry, quartz crystal microbalance, or the like.

In order to narrow the resonance linewidth by reducing disorder in crystallographic orientation and inhomogeneity in composition and reducing strain and defects, the substrate may be heated while the Fe—Co—Al-based magnetic thin film according to the embodiment is formed. Alternatively, the Fe—Co—Al-based magnetic thin film may be heated subsequent to the formation of the film. Heating of the substrate or the atmosphere during or after the formation of the film is desirably performed in an inert gas, such as argon, or in vacuum in order not to oxidize the sample.

A protective film composed of Mo, W, Ru, Ta, or the like may be formed on top of the Fe—Co—Al alloy magnetic thin film according to the embodiment in order to prevent oxidation of the magnetic thin film.

EXAMPLES

The Fe—Co—Al alloy magnetic thin film according to the embodiment is described in further detail with reference to Examples below, which do not limit the scope of the present invention.

Preparation of Samples

The target materials used were Fe, Fe-34at % Co, and Al. The substrate used for film deposition was a single-crystal MgO substrate having a surface that was the (100) plane. Film deposition was performed by a multilayer-film method in which magnetron sputtering is used. The single-crystal MgO substrate was placed on a sample holder provided with a heater with which the temperature can be controlled. Four sputtering guns were used in film deposition. The above three targets and a Ru target for protective film were each placed in a specific one of the sputtering guns. The atmosphere for film deposition was an Ar gas ($4\times10^{-3}$ Torr). On and above the substrate, an Fe layer, an Fe-34at % Co layer, and an Al layer were deposited on top of one another in this order. The above process was considered to be one cycle. Films having various thicknesses were prepared by changing the number of the cycles N. The film-deposition rates of the Fe layer, the Fe-34at % Co layer, and the Al layer were set to 1.5, 1.7, and 0.038 nm/s, respectively. The compositions of the magnetic thin films were each controlled by adjusting the thicknesses of the above layers by changing the respective film-deposition times. Some of the magnetic thin films were prepared without heating the substrate, while the other magnetic thin films were prepared while the temperature of the substrate was controlled to be within the range of 100° C. to 350° C. An Ru protective layer having a thickness of 5 nm was formed on each of the magnetic thin films immediately after the film had been formed.

Structure and Property Evaluation

The thicknesses of the Fe—Co—Al alloy thin films were determined by X-ray reflectometry. The crystal structures of the Fe—Co—Al alloy thin films were confirmed by an electron diffraction analysis in which a TEM was used and by an X-ray diffraction analysis. An in-plane XRD pattern of each of the Fe—Co—Al alloy thin films was measured in order to determine the crystallographic orientation of the epitaxially grown film. The compositions of the samples were measured by X-ray Photoelectron Spectroscopy (XPS). The saturation magnetization and coercive force of each of the samples were determined with a vibrating sample magnetometer (VSM). The resonance linewidth and effective damping factor of each of the samples were determined on the basis of FMR measured at 12 to 66 GHz and 0 to 16.5 kOe. Table shows the structure and magnetic properties of each of thin films having a composition of $Fe_{73}Co_{25}Al_{2}$ which were prepared by changing the number of film-deposition cycles N and the temperature Ts at which the substrate was heated during film deposition.

The samples used in Comparative examples 1 and 2 were prepared without heating the substrate. The results of the TEM electron diffraction analysis of the samples confirmed ring-like patterns corresponding to (110), (200), and (211) of the body-centered cubic (bcc) structure. That is, the samples used in Comparative examples 1 and 2 had the bcc structure but did not have a particular crystallographic orientation. The results of the measurement of magnetic properties show that the samples used in Comparative examples 1 and 2 had a large magnetization, a small coercive force, and a low damping factor but had a large linewidth, that is, 77 Oe and 194 Oe, respectively.

The samples used in Examples 1 to 5 were prepared while the MgO substrate was heated at 100° C. to 350° C. The results of the in-plane X-ray diffraction analysis confirmed that four peaks corresponding to bcc(200) occurred at intervals of 90° when each of the samples prepared in Examples 1 to 5 was rotated one revolution in the in-plane direction regardless of the thickness of the sample or the temperature Ts of the substrate. Four peaks corresponding to MgO(200) of the single-crystal substrate also occurred at intervals of 90° and were out of phase with the peaks of the Fe—Co—Al thin film by 45°. This confirmed that the (100) plane of the Fe—Co—Al film was parallel to the (100) plane of MgO, which is the surface of the MgO substrate, and the <100> direction of the Fe—Co—Al film and the <100> direction of the MgO substrate were displaced 45° with each other. Consequently, the thickness direction of the Fe—Co—Al film was considered to be parallel to the <100> direction of the Fe—Co—Al film. The results of the measurement of crystallographic orientation prove that, in Examples 1 to 5, an Fe—Co—Al alloy film was epitaxially grown on the MgO substrate.

The samples prepared in Comparative examples 1 and 2 and Examples 1 to 5 had a large saturation magnetization Ms of 1440 to 1610 emu/cc, a small Hc of 12 to 47 Oe, and a low effective damping factor of 0.001 to 0.005, which was comparable to or lower than that described in NPL 1. However, the FMR linewidth values ΔH of the samples prepared in Comparative examples 1 and 2 were different from those of the samples prepared in Examples 1 to 5. A comparison in ΔH at 30 GHz between Examples and Comparative examples confirmed that the ΔH values of the samples prepared in Examples 1 to 4 were 30 to 46 Oe, which were lower than the ΔH (77 Oe) of the sample prepared in Comparative example 1 and the ΔH of the sample prepared in Example 5 was 65 Oe, which was lower than the ΔH (194 Oe) of the sample prepared in Comparative example 2.

TABLE

| | Ts [° C.] | N | Thickness [nm] | Crystal structure | Epitaxial growth | Ms [emu/cc] | Hc [Oe] | $\alpha_{eff}$ | ΔH (at 30 GHz) [Oe] |
|---|---|---|---|---|---|---|---|---|---|
| Comparative example 1 | Ambient | 5 | 10 | b.c.c | No | 1460 | 18 | 0.004 | 77 |
| Example 1 | 100 | 5 | 10 | b.c.c | Yes | 1580 | 12 | 0.004 | 46 |
| Example 2 | 200 | 5 | 10 | b.c.c | Yes | 1440 | 17 | 0.005 | 44 |
| Example 3 | 300 | 5 | 10 | b.c.c | Yes | 1520 | 20 | 0.002 | 30 |
| Example 4 | 350 | 5 | 10 | b.c.c | Yes | 1580 | 20 | 0.003 | 44 |
| Comparative example 2 | Ambient | 37 | 80 | b.c.c | No | 1610 | 32 | 0.001 | 194 |
| Example 5 | 100 | 37 | 80 | b.c.c | Yes | 1600 | 47 | 0.002 | 65 |

It is considered that the elimination of extrinsic factors resulting from the microstructure of the material, such as reductions in disorder in crystallographic orientation, inhomogeneity in element distribution, defects and strains, reduced the resonance linewidth of the samples prepared in Examples 1 to 5.

The above results show that the Fe—Co—Al alloy magnetic thin film according to the embodiment has a crystallographic orientation such that the (100) plane is parallel to the substrate surface and the <100> direction is perpendicular to the substrate surface and good magnetic properties, that is, a magnetization of 1440 emu/cc or more, a coercive force of less than 100 Oe, a damping factor of less than 0.01, and a FMR linewidth ΔH at 30 GHz of less than 70 Oe.

The magnetic material according to the embodiment may have a large magnetization, a low damping factor, a small resonance linewidth, and a small coercive force and may be suitable for use in the gigahertz band.

What is claimed is:

1. An Fe—Co—Al alloy magnetic thin film disposed on a surface of a substrate, the Fe—Co—Al magnetic thin film comprising, in terms of atomic ratio based on a total amount of Fe, Co, and Al:

20% to 30% Co;
1.5% to 2.5% Al; and
a balance of Fe;
the Fe—Co—Al alloy magnetic thin film having a crystallographic orientation such that a (100) plane is parallel to the surface of the substrate and a <100>direction is perpendicular to the surface of the substrate.

2. The Fe—Co—Al alloy magnetic thin film of claim 1, wherein the substrate comprises a metal, glass, silicon, or a ceramic.

3. The Fe—Co—Al alloy magnetic thin film of claim 1, wherein the substrate comprises MgO.

4. The Fe—Co—Al alloy magnetic thin film of claim 1, wherein the substrate comprises a single-crystal MgO substrate whose (100) plane serves as the surface.

5. The Fe—Co—Al alloy magnetic thin film of claim 1, wherein a protective film is deposited on top of the Fe—Co—Al alloy magnetic thin film such that the Fe—Co—Al alloy magnetic thin film is disposed between and in contact with the protective film and the surface of the substrate, the protective film comprising Mo, W, Ru, or Ta.

6. The Fe—Co—Al alloy magnetic thin film of claim 1, wherein the Fe—Co—Al alloy magnetic thin film has a composition, in terms of atomic ratio, of 73% Fe, 25% Co, and 2% Al.

7. The Fe—Co—Al alloy magnetic thin film of claim 1 wherein the Fe—Co—Al alloy magnetic thin film has a thickness of 10 nm.

8. The Fe—Co—Al alloy magnetic thin film of claim 1, wherein the Fe—Co—Al alloy magnetic thin film comprises an epitaxial thin film grown on the surface of the substrate.

9. The Fe—Co—Al alloy magnetic thin film of claim 1, wherein the Fe—Co—Al alloy magnetic thin film has a magnetization of 1440 emu/cc or more.

10. The Fe—Co—Al alloy magnetic thin film of claim 1, wherein the Fe—Co—Al alloy magnetic thin film has a coercive force of less than 100 Oe.

11. The Fe—Co—Al alloy magnetic thin film of claim 1, wherein the Fe—Co—Al alloy magnetic thin film has a damping factor of less than 0.01.

12. The Fe—Co—Al alloy magnetic thin film of claim 1, wherein the Fe—Co—Al alloy magnetic thin film has an FMR linewidth ΔH at 30 GHz of less than 70 Oe.

13. The Fe—Co—Al alloy magnetic thin film of claim 1, wherein the Fe—Co—Al alloy magnetic thin film has a magnetization of 1440 emu/cc or more, a coercive force of less than 100 Oe, a damping factor of less than 0.01, and an FMR linewidth ΔH at 30 GHz of less than 70 Oe.

* * * * *